United States Patent [19]
Wilson

[11] Patent Number: 5,057,965
[45] Date of Patent: Oct. 15, 1991

[54] WORK STATION MONITOR

[75] Inventor: Robert W. Wilson, Austin, Tex.

[73] Assignee: Minnesota Mining and Manufacturing Company, St. Paul, Minn.

[21] Appl. No.: 376,113

[22] Filed: Jul. 6, 1989

[51] Int. Cl.⁵ .......................... G01R 31/02; H05F 3/02
[52] U.S. Cl. ..................... 361/212; 340/652; 324/538; 324/705; 324/713
[58] Field of Search ............... 361/42, 212, 220, 573; 340/573, 649, 650, 652, 653; 324/64, 692, 722

[56] References Cited

U.S. PATENT DOCUMENTS

| | | | |
|---|---|---|---|
| 4,398,277 | 8/1983 | Christiansen et al. | 361/220 |
| 4,558,309 | 12/1985 | Antonevich | 340/649 |
| 4,580,188 | 4/1986 | Brown et al. | 361/212 |
| 4,605,984 | 8/1986 | Fiedler | 361/220 |
| 4,638,399 | 1/1987 | Maroney et al. | 361/220 |
| 4,639,825 | 1/1987 | Breidegam | 361/212 |
| 4,649,374 | 3/1987 | Hoigaard | 340/573 |
| 4,710,751 | 12/1987 | Webster | 261/220 X |
| 4,720,764 | 1/1988 | Lucas | 361/212 |
| 4,745,519 | 5/1988 | Breidegam | 361/212 X |
| 4,785,294 | 11/1988 | Campbell | 340/649 |

OTHER PUBLICATIONS

3M Circular entitled "716 Wrist Strap" Tester, published in Jan., 1989.

Primary Examiner—A. D. Pellinen
Assistant Examiner—David Osborn
Attorney, Agent, or Firm—Gary L. Griswold; Walter N. Kirn; Jack V. Musgrove

[57] ABSTRACT

A device for monitoring the grounding characteristics of both an electrically dissipative work surface and a conductive wrist strap having a grounding tether. The device includes a mat monitor and a strap monitor. The mat monitor checks the resistance of the mat ground path and alerts the user if this resistance exceeds a predetermined resistance. The strap monitor checks the resistance of the wrist strap and tether ground path, and employs a timer to send electrical pulses to the wrist strap rather than having a constant voltage output to the strap. The strap monitor establishes a resistance window for the strap ground path, and alerts the user if the strap ground path resistance falls outside of the resistance window.

18 Claims, 3 Drawing Sheets

WORK STATION MONITOR

BACKGROUND OF THE INVENTION

1. Field of the Invention

The present invention generally relates to the control of electrostatic discharge, and more particularly to a device which monitors work surfaces and human operators to insure substantial elimination of electrostatic discharge in the manufacture or assembly of sensitive electronic components.

2. Description of the Prior Art

Electrostatic discharge, as well as the mere presence of a static electric field, can be extremely detrimental to sensitive electronic parts. This is particularly true of modern semiconductors and integrated circuits which may be degraded or destroyed by the buildup of static electricity in the workplace. Especially sensitive components can be severely affected by a potential as small as 50 volts, yet the simple act of walking has been known to triboelectrically generate a potential of 30,000 volts or more.

The most common tool heretofore used in the battle against electrostatic discharge is a conductive wrist strap which connects the wearer to a ground via a grounding tether. A wide variety of wrist straps have been devised, such as that described in U.S. Pat. No. 4,398,277 issued to Christiansen et al. The next logical step in improving upon this idea was to periodically check the conductive integrity of these wrist straps. For example, Minnesota Mining & Manufacturing Co. (assignee of the present invention) markets a wrist strap tester under the brand name "CHARGE-GUARD." This device not only test the maximum resistance of the strap (to insure adequate drainage of static buildup), but also checks the minimum resistance to insure that the user will be protected from dangerous levels of current which may be introduced in the path to ground.

A further refinement of the strap tester has resulted in devices which continually monitor the integrity of the strap. Two such devices are disclosed in U.S. Pat. No. 4,558,309 issued to J. Antonevich and U.S. Pat. No. 4,638,399 issued to Maroney et al. The Antonevich monitor constantly checks the electrical continuity between the wrist strap and ground, alerting the user when a break in continuity occurs. It does not, however, test for minimum resistance (i.e., a possible dangerous current path through the strap to ground). The Maroney et al. apparatus employs phase comparison between a control signal and a composite signal (affected by the strap integrity) to monitor the path to ground. It also does not check for a minimum resistance, although it does detect a short and also has a current limiting resistor in place to minimize shock hazard.

One particular disadvantage of the Maroney et al. and Antonevich devices relates to their use of the effective impedance of the individual wearing the wrist strap in evaluating the integrity of the strap and tether. The effective impedance is a function of both the resistance and capacitance of the individual. Therefore, it is possible to have a situation wherein the resistance is extremely high, but the monitor nevertheless detects a proper grounding resistance exists. For example, if an insulative or dielectric material is placed between the wrist strap and the skin of the individual, the ground path resistance becomes unacceptable, yet the capacitive coupling of the wrist strap with the skin can mislead the monitor into believing that a conductive path exists between the strap and the wearer. This problem is especially acute when the wearer has very dry skin, or has placed an insulative garment between the strap and skin.

While Maroney et al. and Antonevich utilize an AC signal (which is affected by the impedance of the person being monitored), some devices use a DC signal applied to the wriststrap. One such device is disclosed in U.S. Pat. No. 4,639,825 issued to A. Breidegam. This patent describes a monitoring circuit, as well as a special dual conductor wrist strap. The circuit constantly monitors the ground path, and is affected by the resistance across the wrist strap, not the effective impedance of the individual.

One disadvantage of continual monitors (particularly the DC monitors such as Breidegam) relates to the voltage impressed upon the surface of the skin of the person wearing the wrist strap (see, e.g., Maroney et al, col. 5, lines 24–38). Some individuals are particularly sensitive to electrical currents across the skin, and use of constant monitoring device can cause rashes and other skin eruptions to appear on such individuals. This effect is pronounced when the strap is worn day after day, which is typical for assembly line workers. Prior to the conception of the subject invention, no one has been able to provide continual monitoring of wrist straps without also subjecting workers to voltages which, over long periods, may result in great discomfort. Avoidance of constant electrical output provides an additional advantage when the power supply is portable, i.e., a battery.

The above-described devices are further limited in that they assist only in eliminating static buildup on the human technician, and do nothing to prevent electrostatic discharge emanating from the work surface. In this regard, static dissipative work surfaces, floor mats, etc., are presently used at work stations in order to prevent transient electromagnetic fields from affecting nearby electronic components. The static dissipative work surfaces, like the wrist straps, are also connected to ground to allow drainage of excess electrical charge.

One apparatus designed to monitor the grounding ability of work surfaces, as well as the technician's wrist strap, is illustrated in U.S. Pat. No. 4,649,374 issued to J. Hoigaard. This monitor, which probably represents the closest prior art with respect to the subject invention, also provides for detection of unsafe electrical potentials at the tip of a soldering iron. The Hoigaard device, however, still suffers from several disadvantages. First of all, the wrist strap is not continually monitored, but rather requires "touch-to-test" activation. This means that the user must remember to periodically check the strap during the day, i.e., "after starting work, each break, and after lunch" (col. 5, lines 46–53). Manual interaction with the device introduces obvious quality assurance problems. Furthermore, the visual indicators on the Hoigaard device are difficult to interpret as there is only a single lamp to indicate whether the strap integrity is acceptable. This creates a further problem if the lamp is burned out since, in such a case, there is no way to determine if the lamp is broken or the wrist strap grounding path is improper. It would, therefore, be desirable and advantageous to devise a wrist strap/work surface monitor which continually checks the integrity of the strap ground without irritation of the skin, and which also provides unambiguous visual and aural signals to the user.

Accordingly, the primary object of the present invention is to provide a monitor for checking the integrity of the grounding path for a conductive wrist strap.

Another object of the invention is to provide such a device which also monitors the dissipative characteristics of the work surface.

Still another object of the invention is to provide a wrist strap monitor which continually checks the strap grounding path without aggravating the skin of the user.

Yet another object of the invention is to provide a monitor having clear visual and aural indicators for specifying the status of the wrist strap and work surface ground paths.

SUMMARY OF THE INVENTION

The foregoing objects are achieved in a dual workstation monitor having strap and work surface monitors which continually check the grounding path for the strap and work surface. The strap monitor utilizes a timer to send a pulsed signal to the wrist strap in order to minimize electrical irritation, and tests for both maximum and minimum resistance of the strap grounding path. If the path resistance exceeds the maximum resistance, a red LED is illuminated, and an alarm sounded. If, on the other hand, the path resistance falls below the minimum resistance, a yellow LED is illuminated, but no alarm sounds. A separate red LED is used to indicate unacceptable grounding of the work surface. A fourth, green LED is illuminated only if both the strap grounding path and the work surface grounding path resistances are acceptable. The LED's are activated by operational amplifiers which serve as voltage comparators to establish acceptable resistance values for the grounding paths.

BRIEF DESCRIPTION OF THE DRAWINGS

The novel features of the invention are set forth in the appended claims. The invention itself, however, will best be understood by reference to the accompanying drawings, wherein:

DESCRIPTION OF THE PREFERRED EMBODIMENT

Figure 1A:
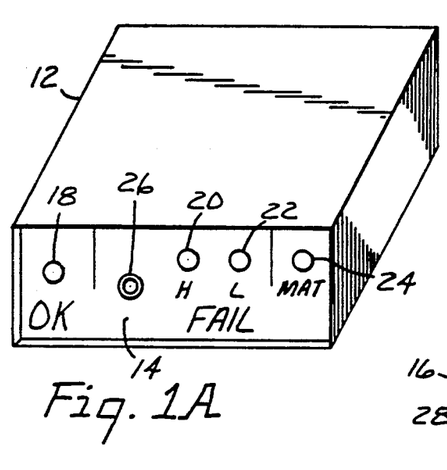
FIGS. 1A and 1B are front and rear perspective views, respectively, of the dual workstation monitor of the present invention.
Figure 1B:
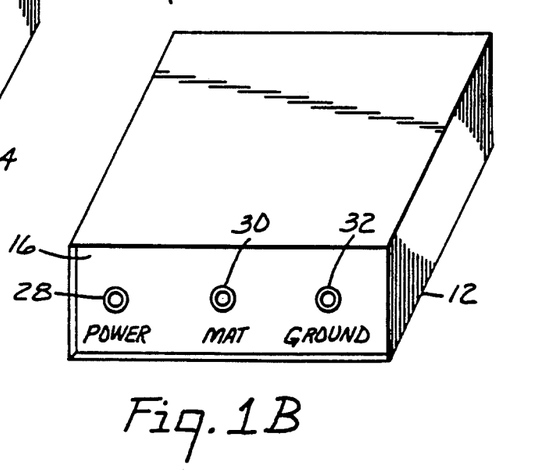

With reference now to the figures, and in particular with reference to FIGS. 1A and 1B, there is depicted a dual workstation monitor 10. Dual workstation monitor 10 includes a housing 12, front panel 14 and rear panel 16. Front panel 14 has four visual annunciators 18, 20, 22 and 24. In the preferred embodiment, the annunciators are light-emitting diodes (LED's). Annunciator 18 is a green LED; annunciator 20 is a red LED; annunciator 22 is a yellow LED; and annunciator 24 is another red LED. Front panel 14 also includes words or symbols which explain the significance of the annunciators. The term "OK" appears under green LED 18, while the term "FAIL" appears under the remaining LED's. Red LED 20 and yellow LED 22 are further marked by the letters "H" and "L," respectively, while red LED 24 has the word "MAT" printed adjacent thereto. The meaning of these terms will become apparent; it is understood, however, that the terms are not to be construed in a limiting sense, and further that the annunciators need not be color-coded.

A phono-type jack 26 is accessed via front panel 14. Jack 26, which receives the tether cable from the wrist strap to be monitored, is explained further below in conjunction with FIG. 4. Three other jacks appear on rear panel 16 of dual workstation monitor 10. Jack 28 is designed to receive the power supply for monitor 10. Jack 30 mates with a plug connected to the static dissipative work surface, While jack 32 is connected to ground. Each of the jacks 28, 30 and 32 may conveniently be labelled as shown.

Figure 2:
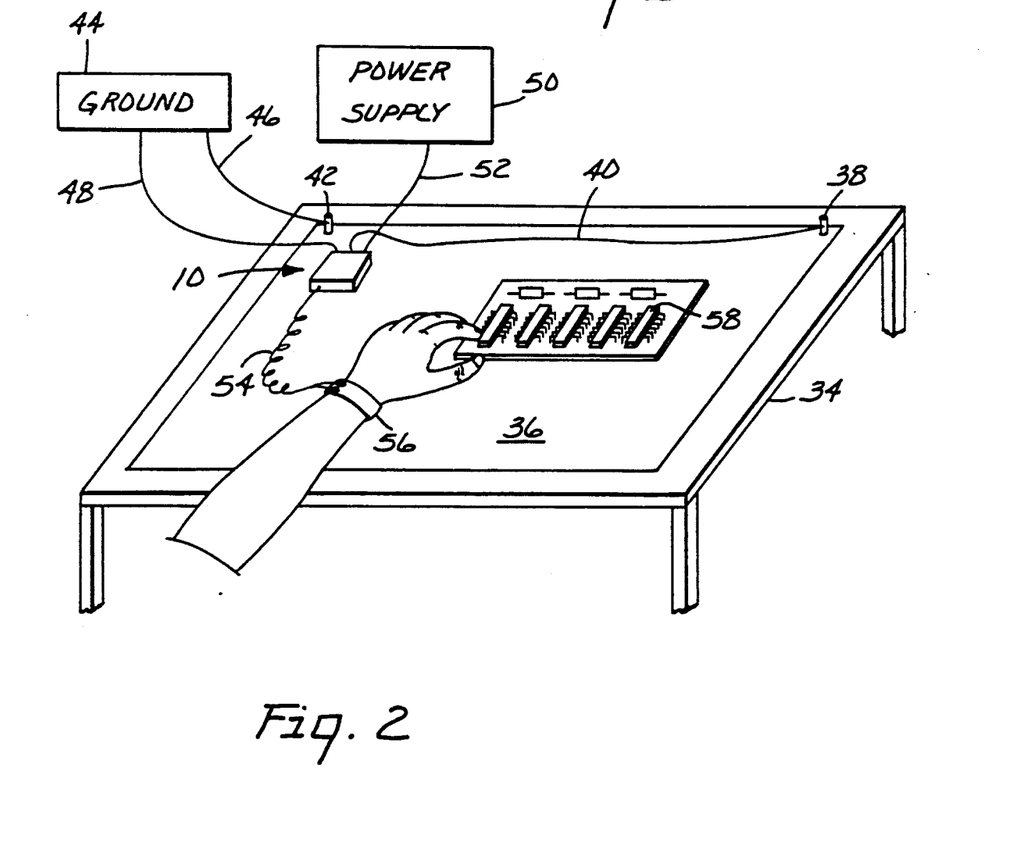
FIG. 2 is a perspective view illustrating the use of the dual workstation monitor with a wrist strap and static-dissipative work surface.

Referring now to FIG. 2, use of dual workstation monitor 10 is explained. Dual workstation monitor 10 is placed on or near the workstation which typically includes a table 34 on which rests a static dissipative work surface, or mat, 36. A post 38 is attached to one corner of mat 36, and a wire 40 connects post 38 to jack 30 of monitor 10. Another post 42 at a different corner of mat 36 is connected to the ground 44 via wire 46. Ground 44 is also connected to jack 32 on rear panel 16 via a third wire 48. A power supply 50 (discussed further below) is connected to jack 28 of monitor 10 via a fourth wire 52.

A tether cable 54 connects the technician's wrist strap 56 to jack 26 of monitor 10. For reasons explained below, it is necessary to employ a wrist strap 56 having two separate conductive sections. Tether 54 accordingly has two separate current paths or wires therein, and terminates in two contacts which are connected to the two conductive sections of wrist strap 56. An exemplary wrist strap is shown in U.S. Pat. No. 4,639,825 issued to A. Breidegam, which has two snap connectors on the surface of the strap for receiving the two contacts of tether 54. As discussed further below, strap 56 and tether 54 drain away excessive static buildup on the technician so avoid damage to the sensitive electronic components 58.

Figure 3:
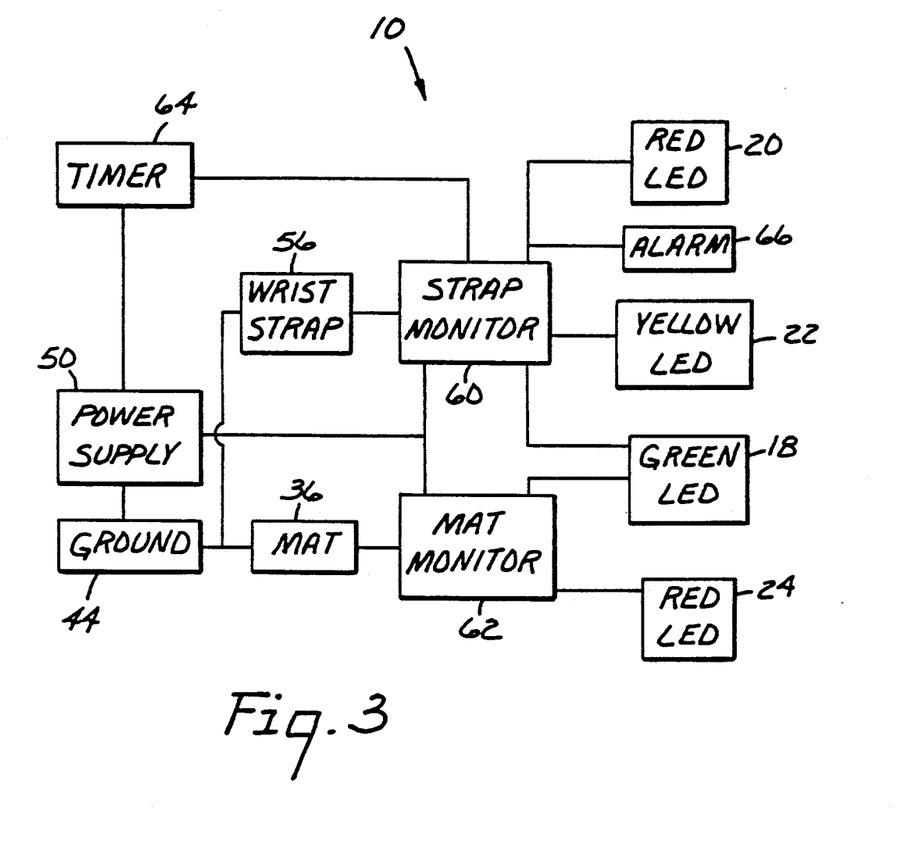
FIG. 3 is a block electrical diagram of the present invention.

With reference now to FIG. 3, a block diagram of the electronics of the present invention is shown. Power supply 50 is connected to ground 44, and to a strap monitor 60 and mat monitor 62 which reside within housing 12 of dual workstation monitor 10. Power supply 50 is also connected to a timer 64 which regulates the pulsed output of strap monitor 60. Strap monitor 60 in turn is connected (via tether 54) to writ strap 56, and to LED's 18, 20 and 22, as well as an audible alarm 66. Mat monitor 62 is connected to mat (dissipative work surface) 36, and to LED's 18 and 24. Green LED 18 is thus affected by both strap monitor 60 and mat monitor 62, and will be illuminated only when the grounding characteristics of both strap 56 and mat 36 are acceptable. Both strap 56 and mat 36 are connected to ground 44. Although power supply 50 and ground 44 are shown in FIG. 3 for clarity, they are not elements of the present invention, and it is anticipated that they will be external to housing 12. The preferred power supply is an 18 volt DC transformer.

Figure 4:
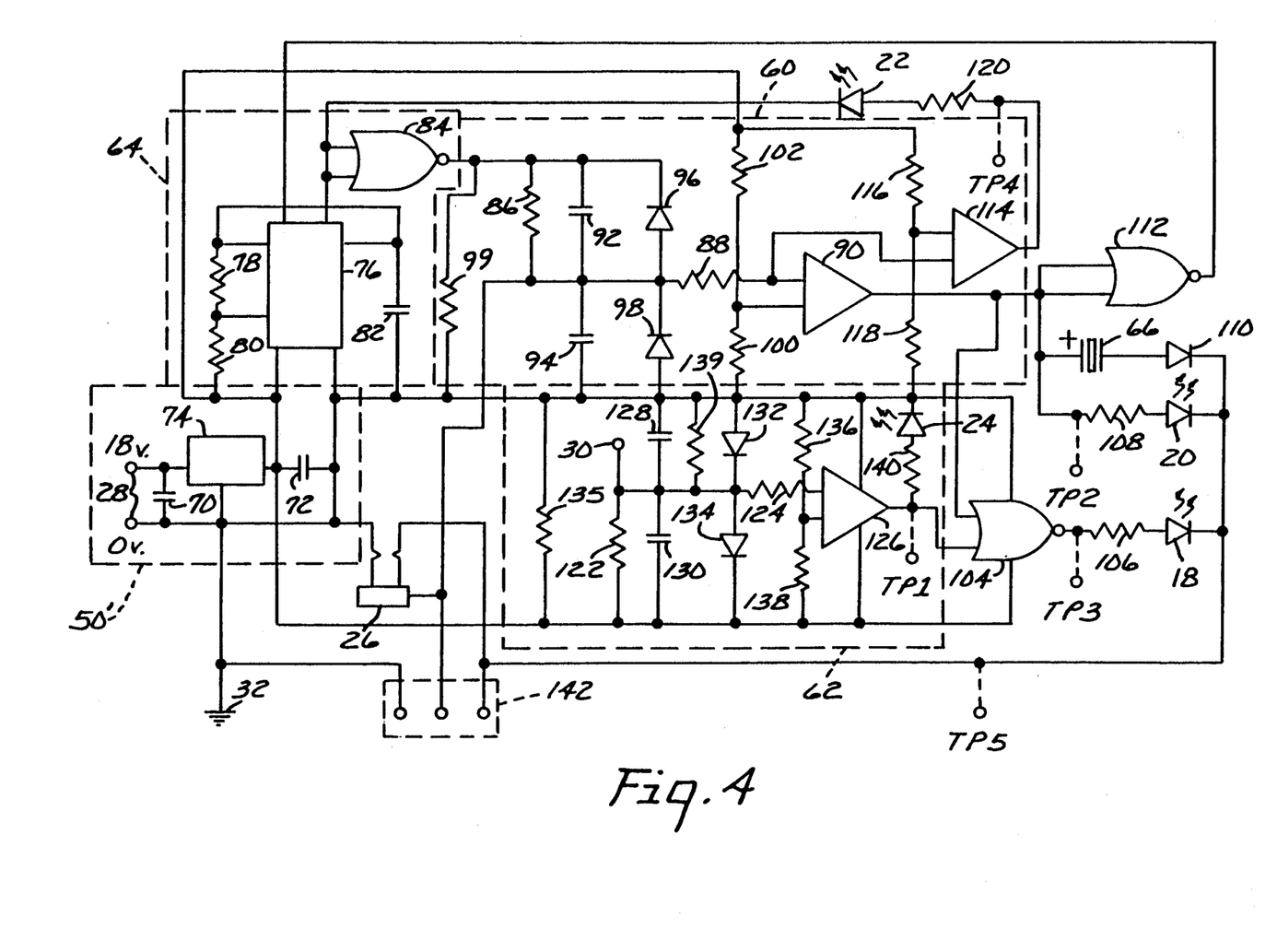
FIG. 4 is a detailed electrical schematic of the dual workstation monitor of the present invention.

The block diagram of FIG. 3 may be more easily understood upon reference to FIG. 4 which is a detailed electrical schematic. The power input portion of the circuitry is designated with the reference numeral 50' to indicate that the actual power supply 50 is external to monitor 10. Power input circuitry 50' includes the power input jack 28, smoothing capacitors 70 and 72, and DC voltage regulator 74. The ground jack 32 is tied to the zero voltage reference of power supply 50. The high voltage side of power input circuitry 50' branches out to timer 64, strap monitor 60 and mat monitor 62.

The heart of timer 64 is a CMOS integrated circuit (IC) chip 76 which provides pulsed power output. Such devices are known in the art, and a suitable chip may be purchased from Texas Instruments of Dallas, Tex., under model number TLC555CP. Although the output of timer 64, and hence strap monitor 60, is pulsed, monitoring of wrist strap 56 is nevertheless "continual" in the sense that it is automatically repeated regularly and frequently. The width of the current pulse and its frequency are controlled by resistors 78 and 80, and by capacitor 82. For the purposes described herein, a period between pulses of approximately five seconds is preferred for a pulse width lasting approximately 0.2 seconds. Of course, other ranges are acceptable, e.g., a period between 1-30 seconds, and a pulse width of 0.05 to 1.0 seconds. Timer 64 includes a NOR gate 84 which simply acts as an inverter in providing the pulsed signal to strap monitor 60. A NOR gate is not essential to the operation of timer 64, but NOR gate 84 is conveniently available inasmuch as other NOR gates are utilized in the present invention, and the gates typically come in a quad dual-inline-package.

The output of NOR gate 84 is fed to one wire of tether 54 via resistor 86 and jack 26, which is actually a three conductor jack. The other two conductors of jack 26 are shorted together when the plug of tether 54 is inserted into jack 26, thereby enabling LED's 18 and 20 (by providing a path to ground). This also means that removal of the tether from jack 26 will prevent those LED's, as well as alarm 66, from energizing. The output of NOR gate 84 is also directed, via resistor 88, to the positive input of an operational amplifier (op amp) 90. Capacitors 92 and 94, as well as diodes 96 and 98, protect against damage to the strap monitor circuitry resulting from charge drainage through tether 54. A bleed resistor 99 prevents excess charge accumulation on capacitors 92 and 94.

The negative input of op amp 90 is connected to the ground line with an intervening resistor 100, and to the high voltage line with an intervening resistor 102. Op amp 90 thereby serves as a voltage comparator and, in combination with resistors 86, 88, 100 and 102, establishes a maximum resistance threshold for the strap ground path. In the preferred embodiment, the maximum acceptable resistance is about 5 megohms, although this value could vary within the range of 2 to 20 MΩ. As those skilled in the art will appreciate, the total strap ground path resistance being measured includes the skin resistance between the two conductive portions of wrist strap 56. This provides the further advantage of assuring that the strap is properly contacting the wrist. Under normal conditions, skin resistance (non-ohmic) varies from about 100 kΩ to about 5 MΩ.

As long as the strap ground path resistance is less than the maximum threshold resistance, op amp 90 will output a low (zero) voltage level to another NOR gate 104 which receives its second input from mat monitor 62. Only when both of these inputs are at the low (zero) voltage level will the output of NOR gate 104 be high (i.e., about 18 volts). This results in illumination of green LED 18, which is connected to NOR gate 104 via a current limiting resistor 106.

On the other hand, if the strap ground path resistance rises above the maximum threshold (indicating insufficient drainage of electrostatic potential from the wrist strap), then the output of op amp 90 goes high. This switches the output of NOR gate 104 off, and extinguishes LED 18. The output of op amp 90 is also connected to red LED 20, via a current limiting resistor 108, and alarm 66 (preferably a piezoelectric buzzer). Therefore, a positive output at op amp 90 results in the illumination of red LED 20 and energization of alarm 66. Diode 110 acts to prevent unintentional activation of alarm 66.

The output of op amp 90 is further connected to both inputs of a third NOR gate 112. Hence, NOR gate 112 simply acts as inverter, but is available in the quad DIP as discussed above. The output of NOR gate 112 is connected to the reset pin of timing chip 76. Thus, when an excessive strap ground path resistance is detected, strap monitor 60 "latches" to a non-pulsed state for constant supervision of the path resistance. This effectively disables timer 64. This also means that red LED 20 and alarm 66 will be energized constantly, rather than pulsating, until the path resistance falls below the maximum threshold. If the resistance does return to an acceptable value then the output of op amp 90 reverts to a low level which, in turn, changes the output of NOR gate 112 and returns strap monitor 60 to a pulsating cycle.

The output of NOR gate 84 is also connected, via resistors 86 and 88, to the negative input of another operational amplifier 114. The positive input of op amp 114 is connected to the power supply by way of resistor 116 and to the ground line by way of resistor 118. In this manner, op amp 114 serves as a voltage comparator (similar to op amp 90) and, in combination with resistors 86, 88, 116 and 118, establishes a minimum resistance threshold for the strap ground path. Provision of a minimum resistance check warns the user of a possible shock hazard due to dangerous levels of current which may be introduced in the path to ground. In the preferred embodiment, the minimum acceptable resistance is about 1.5 megohms, although this value could vary within the range of 200 kΩ to 2 MΩ.

As long as the strap ground path resistance is greater than the minimum threshold resistance, op amp 114 will output a low (zero) voltage level. If, however, the path resistance should fall below the minimum threshold, the output of op amp 114 goes high and illuminates yellow LED 22 which is connected to op amp 114 via a current limiting resistor 120. The output of op amp 114 may optionally be connected to NOR gate 104, alarm 66 and/or NOR gate 112, but in the preferred embodiment, it is not connected to any of these. In this manner, yellow LED 22 will flash (with the period set by timer 64) while green LED 18 remains lit.

Turning now to mat monitor 62, the regulated voltage from power input circuitry 50' is directed, via resistor 122, to mat jack 30. Mat jack 30, in turn, is connected, via resistor 124, to the positive input of a third operational amplifier 126. Capacitors 128 and 130, as well as diodes 132 and 134, protect against damage to the mat monitor circuitry resulting from charge drainage through wire 40. A bleed resistor 135 prevents excess charge accumulation on capacitors 128 and 130. The negative input of op amp 126 is connected to the ground line with an intervening resistor 136, and to the high voltage line with an intervening resistor 138.

As with the prior two operational amplifiers, op amp 126 serves as a voltage comparator and, in combination with resistors 122, 124, 136, 138, and 139 establishes a maximum resistance threshold for the mat ground path. In the preferred embodiment, the maximum acceptable resistance is about 4 megohms, although this value could vary within the range of 2 to 20 MΩ. As long as the mat ground path resistance is less than the maximum threshold resistance, op amp 126 will output a low (zero) voltage level to NOR gate 104 which, as explained above, receives its second input from strap monitor 60. If, however, the mat ground path resistance should rise above the maximum threshold, the output of op amp 126 will go high, extinguishing green LED 18, and illuminating red LED 24, which is connected to op amp 126 via a current limiting resistor 140. In the preferred embodiment, mat monitor 62 is not connected to alarm 66 although it could be (or it could be connected to another alarm having a different tone from alarm 66).

The reader may notice that the power supply and ground line are shown connected to NOR gate 104, but not to NOR gates 84 and 112. The latter two gates are identically wired to the power supply and ground line, but these connections are not shown inasmuch as all three of the NOR gates are in the quad DIP which has only one pair of voltage reference inputs. Similarly, only op amp 126 is shown with reference leads, but all three op amps 90, 114 and 126 are conveniently packaged in a quad DIP.

Dual workstation monitor 10 may easily be adapted to provide informative output to a central monitoring location, whereby several such monitors may be simultaneously supervised. This is accomplished by adding another port (not shown) to rear panel 16. The auxiliary port would be connected to various junctions in the circuitry of dual workstation monitor 10. For example, an auxiliary port with five contacts could provide connection to the following junctions: test point one (TP1) at the output of op amp 126; test point two (TP2) at the output of op amp 90; test point three (TP3) at the output of NOR gate 104; test point four (TP4) at the output of op amp 114; and test point five (TP5) at the output LED's 18 and 20.

Additionally, dual workstation monitor 10 is designed for flexibility in the workplace. In those situations where no dissipative work surface is present, the wire 40 normally attached to work surface 36 may simply be connected to ground. The same outcome occurs if wire 40 is discarded and wire 46 (normally between the ground and work surface 36) is plugged into jack 30. Dual workstation monitor 10 may also conveniently be used at distant locations by the provision of a remote jack 142 connected in parallel to the conductors of jack 26.

Although the invention has been described With reference to specific embodiments, this description is not meant to be construed in a limiting sense. Various modifications of the disclosed embodiment, as well as alternative embodiments of the invention, will become apparent to persons skilled in the art upon reference to the description of the invention. For example, the connection between strap monitor 60 and mat monitor 62 leading to green LED 18 might be made in series. Also, mat monitor 62 should more properly be thought of as a monitor for any static dissipative structure, such as floor mats, tote boxes, shielding bags, etc. In fact, as those skilled in the art will appreciate, the circuitry of dual workstation monitor 10 may easily be modified to allow monitoring of more than just two grounding paths, e.g., it might monitor a wrist strap, a table surface, and a floor mat. Furthermore, the pulse output feature of the invention could be utilized in a monitor which supervises a wrist strap only, and not a dissipative surface. It is therefore contemplated that the appended claims will cover such modifications that fall within the true scope of the invention.

I claim:

1. A device for indicating the grounding ability of both an electrically dissipative surface and a conductive wrist strap having a grounding tether, comprising:
   housing means;
   first jack means located in said housing means for receiving the grounding tether;
   second jack means located in said housing means for receiving a wire attached to the electrically dissipative surface;
   first means for monitoring the ground path resistance of the conductive wrist strap and grounding tether, said first means performing said monitoring periodically on a continual basis in response to timing means which pulses an input to said first means, said input also being connected to the tether and wrist strap;
   second means for continually monitoring the ground path resistance of the dissipative surface; and
   means for electrically connecting said first and second monitor means to an external power supply and an external ground.

2. The device of claim 1 further comprising first indicator means responsive to said first and second monitoring means for indicating acceptable ground path resistances of both the wrist strap and the dissipative surface.

3. The device of claim 2 wherein said first monitoring means includes means for disabling said timing means when an unacceptably high ground path resistance through the wrist strap and tether exists, said disabling means thereby causing said first monitoring means to latch to a constant, non-interrupted and non-pulsed output until the ground path resistance through the wrist strap and tether returns to an acceptable value.

4. The device of claim 3 further comprising:
   second indicator means responsive to said first monitoring means or indicating an unacceptably high ground path resistance through the wrist strap and tether;
   third indicator means responsive to said first monitoring means for indicating an unacceptably low ground path resistance through the wrist strap and tether; and
   fourth indicator means responsive to said second monitoring means for indicating an unacceptably high ground path resistance through the dissipative surface.

5. The device of claim 4 wherein:
   said first monitoring means further includes first and second voltage comparison means for establishing maximum and minimum strap resistance thresholds, respectively, for the grounding path through the wrist strap and tether; and
   said second monitoring means further includes third voltage comparison means for establishing a maximum surface resistance threshold for the grounding path through the dissipative surface.

6. The device of claim 5 wherein:

said first voltage comparison means outputs a low voltage level when the resistance through the wrist strap and tether is below said maximum strap resistance threshold, and outputs a high voltage level when the resistance through the wrist strap and tether is above said maximum strap resistance threshold;

said third voltage comparison means outputs a low voltage level when the resistance through the dissipative surface is below said maximum surface resistance threshold, and outputs a high voltage level when the resistance through the dissipative surface is above said maximum surface resistance threshold; and said outputs of said first and third voltage comparison means are connected as inputs to a NOR gate, the output of said NOR gate being connected to said first indicator means.

7. The device of claim 6 wherein:
said first indicator means comprises a green LED;
said second indicator means comprises a first red LED and an audible alarm;
said third indicator means comprises a yellow LED; and
said fourth indicator means comprises a second red LED.

8. The device of claim 3 wherein:
said first monitoring means further includes first and second voltage comparison means for establishing maximum and minimum strap resistance thresholds, respectively, for the grounding path through the wrist strap and tether; and
said second monitoring means further includes third voltage comparison means for establishing a maximum surface resistance threshold for the grounding path through the dissipative surface.

9. The device of claim 8 wherein:
said first voltage comparison mans outputs a low voltage level when the resistance through the wrist strap and tether is below said maximum strap resistance threshold, and outputs a high voltage level when the resistance through the wrist strap and tether is above said maximum strap resistance threshold;
said third voltage comparison means outputs a low voltage level when the resistance through the dissipative surface is below said maximum surface resistance threshold, and outputs a high voltage level when the resistance through the dissipative surface is above said maximum surface resistance threshold; and
said outputs of said first and third voltage comparison means are connected as inputs to a NOR gate, the output of said NOR gate being connected to said first indicator means.

10. The device of claim 2 further comprising:
second indicator means responsive to said first monitoring means for indicating a high ground path resistance through the wrist strap and tether;
third indicator means responsive to said first monitoring means for indicating an unacceptably low ground path resistance through the wrist strap and tether; and
fourth indicator means responsive to said second monitoring means for indicating an unacceptably high ground path resistance through the dissipative surface.

11. A dual workstation monitor which alerts its user to the existence of unacceptable resistances in the ground paths of both an electrically dissipative surface and a conductive wrist strap having a grounding tether, comprising:
a housing;
a first jack located in said housing for receiving the grounding tether;
a first wire for attachment to the electrically dissipative surface;
a second jack located in said housing for receiving said first wire;
a second wire for attachment to ground;
a third jack located in said housing for receiving said second wire;
a fourth jack located in said housing for connection to an external DC power supply;
strap monitor means for monitoring the resistance of the ground path of the conductive wrist strap and grounding tether, said strap monitor means being connected to said first, third and fourth jacks, and performing said monitoring periodically on a continual basis in response to timing means which pulses an input to said strap monitor means, said input also being connected to said first jack; and
surface monitor means for continually monitoring the resistance of the ground path of the dissipative surface, said surface monitor means being connected to said second, third and fourth jacks.

12. The dual workstation monitor of claim 11 further comprising:
first indicator means responsive to said strap and surface monitor means for indicating contemporaneous acceptable ground path resistances of both the wrist strap and the dissipative surface;
second indicator means responsive to said strap monitor means for indicating an unacceptably high ground path resistance through the wrist strap and tether;
third indicator means responsive to said strap monitor means for indicating an unacceptably low ground path resistance through the wrist strap and tether; and
fourth indicator means responsive to said surface monitor means for indicating an unacceptably high ground path resistance through the dissipative surface.

13. The dual workstation monitor of claim 12 wherein:
said strap monitor means further includes first and second voltage comparison means for establishing maximum and minimum strap resistance thresholds, respectively, for the grounding path through the wrist strap and tether; and
said surface monitor means further includes third voltage comparison means for establishing a maximum surface resistance threshold for the grounding path through the dissipative surface.

14. The dual workstation monitor of claim 13 further wherein:
said first voltage comparison means includes a first operational amplifier which outputs a low voltage level when the resistance through the wrist strap and tether is below said maximum strap resistance threshold, and outputs a high voltage level when the resistance through the wrist strap and tether is above said maximum strap resistance threshold;

said third voltage comparison means includes a second operational amplifier which outputs a low voltage level when the resistance through the dissipative surface is below said maximum surface resistance threshold, and outputs a high voltage level when the resistance through the dissipative surface is above said maximum surface resistance threshold; and said outputs of said first and second operational amplifiers are connected as inputs to a NOR gate, the output of said NOR gate being connected to said first indicator means.

15. An electrostatic discharge monitoring system comprising:

an electrically dissipative mat having first and second wires connected thereto at different locations, said first wire being for attachment to an external ground;

a wrist strap having two conductive portions;

a two wire tether connected to said wrist strap;

a DC power supply;

a housing;

a first jack located in said housing for receiving said tether;

a second jack located in said housing for receiving said second wire;

a third jack located in said housing for connection to the external ground;

a fourth jack located in said housing for connection to said power supply;

a strap monitor connected to said first, third and fourth jacks, and including:

timing means for pulsing the output of said strap monitor to said first jack, first voltage comparison means for establishing a maximum strap resistance threshold for the grounding path through said wrist strap and said tether, and second voltage comparison means for establishing a minimum strap resistance threshold for the grounding path through said wrist strap and said tether;

means for establishing said timing means when the ground path resistance through said wrist strap and said tether exceeds said maximum strap resistance, said disabling means thereby causing said strap monitor to latch to a constant non-pulsed output until the ground path resistance through said wrist strap and said tether falls below said maximum strap resistance;

a mat monitor connected to said second, third and fourth jacks and including third voltage comparison means for establishing a maximum mat resistance threshold for the grounding path through said dissipative mat;

first indicator means responsive to said first and third voltage comparison means for indicating contemporaneous acceptable ground path resistances of both said wrist strap and said dissipative mat;

second indicator means responsive to said first voltage comparison means for indicating an unacceptably high ground path resistance through said wrist strap and said tether;

third indicator means responsive to said second voltage comparison means for indicating an unacceptably low ground path resistance through said wrist strap and said tether;

fourth indicator means responsive to said third voltage comparison means for indicating an unacceptably high ground path resistance through said dissipative mat.

16. The electrostatic discharge monitoring system of claim 15 wherein:

said first voltage comparison means includes a first operational amplifier which outputs a low voltage level when the resistance through said wrist strap and said tether is below said maximum strap resistance threshold, and outputs a high voltage level when the resistance through said wrist strap and said tether is above said maximum strap resistance threshold;

said third voltage comparison means includes a second operational amplifier which outputs a low voltage level when the resistance through said dissipative mat is below said maximum mat resistance threshold, and outputs a high voltage level when the resistance through said dissipative mat is above said maximum mat resistance threshold; and said outputs of said first and second operational amplifiers are connected as inputs to a NOR gate, the output of said NOR gate being connected to said first indicator means.

17. The electrostatic discharge monitoring system of claim 15 further comprising:

means for coupling the output of said strap and mat monitors to a central monitoring location; and means for remotely connecting said tether to said first jack.

18. A device for indicating the grounding ability of a conductive strap having a ground tether, comprising:

housing means;

jack means located in said housing means for receiving the grounding tether;

means for monitoring the ground path resistance of the conductive strap and grounding tether, said means performing said monitoring periodically on a continual basis in response to timing means which pulses an input to said means, said input also being connected to the tether and strap; and means for electrically connecting said monitoring means to an external power supply and an external ground.

* * * * *

UNITED STATES PATENT AND TRADEMARK OFFICE
CERTIFICATE OF CORRECTION

PATENT NO. : 5,057,965
DATED : October 15, 1991
INVENTOR(S) : Robert W. Wilson

It is certified that error appears in the above-identified patent and that said Letters Patent is hereby corrected as shown below:

Col. 7, line 55, change "With" to --with--.

Col. 9, line 39, "mans" should read --means--.

Col. 11, line 43, change "establishing" to --disabling--.

Signed and Sealed this

Eighteenth Day of May, 1993

Attest:

MICHAEL K. KIRK

Attesting Officer

Acting Commissioner of Patents and Trademarks